US010081535B2

(12) United States Patent
Chen et al.

(10) Patent No.: US 10,081,535 B2
(45) Date of Patent: Sep. 25, 2018

(54) APPARATUS AND METHOD FOR SHIELDING AND BIASING IN MEMS DEVICES ENCAPSULATED BY ACTIVE CIRCUITRY

(71) Applicant: Analog Devices, Inc., Norwood, MA (US)

(72) Inventors: Li Chen, Belmont, MA (US); Thomas Kieran Nunan, Carlisle, MA (US); Kuang L. Yang, Newton, MA (US); Jeffrey A. Gregory, Malden, MA (US)

(73) Assignee: Analog Devices, Inc., Norwood, MA (US)

( * ) Notice: Subject to any disclaimer, the term of this patent is extended or adjusted under 35 U.S.C. 154(b) by 523 days.

(21) Appl. No.: 13/926,384

(22) Filed: Jun. 25, 2013

(65) Prior Publication Data

US 2014/0374850 A1 Dec. 25, 2014

(51) Int. Cl.
  *B81B 7/00* (2006.01)
  *B81C 1/00* (2006.01)
  (Continued)

(52) U.S. Cl.
  CPC ........ *B81B 7/0029* (2013.01); *B81C 1/00238* (2013.01); *B81C 1/00349* (2013.01);
  (Continued)

(58) Field of Classification Search
  CPC ... H01L 2924/1461; H01L 2924/10253; H01L 2224/81801; H01L 21/02126; H01L 25/0657
  (Continued)

(56) References Cited

U.S. PATENT DOCUMENTS

| 5,719,069 A | 2/1998 | Sparks ............................ 437/59 |
| 5,719,336 A | 2/1998 | Ando et al. ................. 73/514.32 |

(Continued)

FOREIGN PATENT DOCUMENTS

| CN | 1585113 A | 2/2005 | ............. H01L 23/00 |
| CN | 1650427 A | 8/2005 | ........... H01L 23/522 |

(Continued)

OTHER PUBLICATIONS

Singer, Peter, "The Future of Dielectric CVD: High-Density Plasmas?", Semiconductor International, Cahners Publishing, vol. 20, No. 8, dated Jul. 1997, 6 pages.

(Continued)

*Primary Examiner* — Nathan W Ha
(74) *Attorney, Agent, or Firm* — Wolf, Greenfield & Sacks, P.C.

(57) ABSTRACT

One or more conductive shielding plates are formed in a standard ASIC wafer top metal layer, e.g., for blocking cross-talk from MEMS device structure(s) on the MEMS wafer to circuitry on the ASIC wafer when the MEMS device is capped directly by the ASIC wafer in a wafer-level chip scale package. Generally speaking, a shielding plate should be at least slightly larger than the MEMS device structure it is shielding (e.g., a movable MEMS structure such as an accelerometer proof mass or a gyroscope resonator), and the shielding plate cannot be in contact with the MEMS device structure during or after wafer bonding. Thus, a recess is formed to ensure that there is sufficient cavity space away from the top surface of the MEMS device structure. The shielding plate is electrically conductive and can be biased, e.g., to the same voltage as the opposing MEMS device structure in order to maintain zero electrostatic attraction force between the MEMS device structure and the shielding plate.

29 Claims, 6 Drawing Sheets

(51) Int. Cl.
  *H01L 21/02* (2006.01)
  *H01L 25/065* (2006.01)
(52) U.S. Cl.
  CPC .... *H01L 21/02126* (2013.01); *H01L 25/0657* (2013.01); *H01L 2224/81801* (2013.01); *H01L 2924/10253* (2013.01); *H01L 2924/1461* (2013.01)
(58) Field of Classification Search
  USPC ...................................... 257/704; 438/50, 52
  See application file for complete search history.

(56) References Cited

U.S. PATENT DOCUMENTS

| | | | |
|---|---|---|---|
| 5,864,063 A | 1/1999 | Otani et al. | 73/514.32 |
| 5,955,380 A | 9/1999 | Lee | 438/706 |
| 6,015,749 A | 1/2000 | Liu et al. | 438/628 |
| 6,117,791 A | 9/2000 | Ko et al. | 438/723 |
| 6,405,592 B1 | 6/2002 | Murari et al. | 73/493 |
| 6,559,487 B1 | 5/2003 | Kang et al. | 257/254 |
| 6,841,992 B2 | 1/2005 | Yue et al. | 324/162 |
| 6,921,965 B1 | 7/2005 | Ray et al. | 257/659 |
| 7,140,250 B2 | 11/2006 | Leonardson et al. | 73/504.14 |
| 7,146,856 B2 | 12/2006 | Malametz | 73/514.32 |
| 7,498,663 B2* | 3/2009 | Henmi | H01L 23/5225 257/659 |
| 7,557,417 B2 | 7/2009 | Theuss et al. | 257/415 |
| 7,610,809 B2 | 11/2009 | McNeil et al. | 73/514.32 |
| 7,736,931 B1 | 6/2010 | Guo | 438/52 |
| 7,759,768 B2 | 7/2010 | Barth et al. | 257/532 |
| 7,932,568 B2* | 4/2011 | Kuisma et al. | 257/415 |
| 8,146,425 B2 | 4/2012 | Zhang et al. | 73/514.32 |
| 8,164,159 B1 | 4/2012 | Armstrong et al. | 257/E21.022 |
| 8,349,635 B1 | 1/2013 | Gan et al. | 438/50 |
| 9,556,017 B2 | 1/2017 | Chen et al. | |
| 9,640,531 B1* | 5/2017 | Or-Bach | H01L 27/0688 |
| 2002/0197795 A1 | 12/2002 | Saito | 438/257 |
| 2004/0130033 A1 | 7/2004 | Masamitsu et al. | |
| 2004/0248361 A1 | 12/2004 | Oh et al. | 438/240 |
| 2005/0109109 A1 | 5/2005 | Eskridge et al. | 73/514.32 |
| 2006/0205106 A1* | 9/2006 | Fukuda | B81C 1/00246 438/52 |
| 2006/0246631 A1* | 11/2006 | Lutz | B81B 3/0005 438/127 |
| 2007/0164378 A1 | 7/2007 | MacGugan | 257/416 |
| 2007/0190680 A1 | 8/2007 | Fukuda et al. | 438/50 |
| 2008/0238257 A1 | 10/2008 | Kawakubo et al. | 310/325 |
| 2009/0145229 A1 | 6/2009 | Gabara | 73/514.32 |
| 2009/0213561 A1* | 8/2009 | Mi | H01L 23/645 361/782 |
| 2009/0218642 A1* | 9/2009 | Miller | B81C 1/00182 257/416 |
| 2010/0090347 A1* | 4/2010 | Saylor | H01L 21/268 257/773 |
| 2010/0207216 A1 | 8/2010 | Drews et al. | |
| 2010/0242600 A1 | 9/2010 | Lin et al. | 73/504.12 |
| 2012/0104593 A1* | 5/2012 | Kanemoto | B81C 1/00333 257/729 |
| 2012/0126433 A1 | 5/2012 | Montanya Silvestre | 257/787 |
| 2012/0313189 A1 | 12/2012 | Huang et al. | 257/415 |
| 2013/0127036 A1 | 5/2013 | Kuo et al. | 257/704 |
| 2013/0307096 A1* | 11/2013 | Classen | B81B 7/008 257/418 |
| 2013/0319076 A1 | 12/2013 | Moreau | 73/1.38 |
| 2013/0333471 A1 | 12/2013 | Chien | 73/514.32 |
| 2014/0110799 A1* | 4/2014 | Yoshizawa | B81B 7/00 257/415 |
| 2014/0374850 A1 | 12/2014 | Chen et al. | 257/415 |
| 2014/0374856 A1* | 12/2014 | Chen | B81B 3/0059 257/418 |
| 2015/0115376 A1* | 4/2015 | Chen | B81B 3/0094 257/415 |
| 2015/0284240 A1* | 10/2015 | Chu | B81B 7/0041 257/415 |
| 2015/0329353 A1* | 11/2015 | Cheng | B81B 7/0041 257/415 |

FOREIGN PATENT DOCUMENTS

| | | | |
|---|---|---|---|
| EP | 0 951 068 | 10/1999 | ............. H01L 23/10 |
| EP | 1 808 405 | 7/2007 | ............. B81C 1/00 |
| JP | 2004-103813 | 4/2004 | ........ H01L 21/3205 |

OTHER PUBLICATIONS

International Searching Authority, International Search Report—International Application No. PCT/US2014/043791, dated Oct. 7, 2014, together with the Written Opinion of the International Searching Authority, 11 pages.

International Searching Authority, International Search Report—International Application No. PCT/US2013/045647, dated Oct. 1, 2013, together with Written Opinion of the International Searching Authority, 11 pages.

Du, Letter from Hong-Yue Du to Jeffrey T. Klayman, regarding R.O.C. Patent Application No. 103121739, informing of Examiner's tentative rejection, dated Jul. 20, 2015, 3 pages.

Chinese Patent Office, Office Action—Invention No. 201480036001.X, dated Aug. 3, 2016, 8 pages.

Saint Island International Patent & Law Offices, Letter from Ouyang Fan to Jeffrey T. Klayman reporting the First Office Action issued by the Chinese Patent Office for Invention No. 201480036001, dated Aug. 9, 2016, 1page.

Saint Island International Patent & Law Offices, Revised Claims submitted Dec. 29, 2015 in response to Examiner's tentative rejection dated Jul. 20, 2015 in Taiwanese Application No. 103121739, 4 pages.

Taiwan IPO, Official Letter and Search Report for Taiwanese Application No. 103121739, dated Apr. 8, 2016, 6 pages.

Taiwan IPO, English Translation of Search Report—Taiwanese Application No. 103121739, dated Apr. 8, 2016, 1 page.

Saint Island International Patent & Law Offices, Letter from Hong-Yue Du to Jeffrey T. Klayman dated Jun. 3, 2016 providing an English language summary and proposed rebuttal for the Official Letter and Search Report dated Apr. 8, 2016 in Taiwanese Application No. 103121739, dated Jun. 3, 2016, 4 pages.

Saint Island International Patent & Law Offices, Response to Office Action—Taiwan Patent Application No. 103121739, filed Oct. 7, 2016, 13 pages.

International Search Report and Written Opinion dated Oct. 1, 2014 in connection with International Application No. PCT/US2014/043789.

* cited by examiner

APPARATUS AND METHOD FOR SHIELDING AND BIASING IN MEMS DEVICES ENCAPSULATED BY ACTIVE CIRCUITRY

CROSS-REFERENCE TO RELATED APPLICATION(S)

The subject matter of this patent application may be related to the subject matter of United States Patent Application entitled APPARATUS AND METHOD FOR PREVENTING STICTION OF MEMS DEVICES ENCAPSULATED BY ACTIVE CIRCUITRY filed on even date herewith Ser. No. 13/626,257, which is hereby incorporated herein by reference in its entirety.

FIELD OF THE INVENTION

The present invention relates generally to shielding and biasing for MEMS devices encapsulated by active circuitry.

BACKGROUND OF THE INVENTION

It is known to bond an ASIC wafer to a MEMS device wafer to form a wafer-level chip scale package. In such an integrated wafer-level chip scale package, the ASIC wafer is effectively the cap wafer. Depending on the bond seal material thickness or patterned standoff depth, such devices often have a cavity depth on the order of approximately 2-4 micrometers (abbreviated "um" herein). In such devices, the close proximity of MEMS device structures to the ASIC circuitry can result in the MEMS device structures contributing time-varying parasitic capacitance and impedance cross-talk to the circuits that are spaced only a few micrometers away on the ASIC wafer.

SUMMARY OF EXEMPLARY EMBODIMENTS

In a first embodiment there is provided a method for forming conductive shielding plates on an ASIC wafer having a top circuitry layer. The method involves forming a passivation layer above the top circuitry layer layer, forming a TiN layer above the passivation layer, and selectively etching the TiN layer to form at least one conductive shielding plate.

In various alternative embodiments, forming the passivation layer may involve forming a bottom oxide layer, a middle nitride layer, and a top oxide layer. Selectively etching the TiN layer may form a plurality of standoff bases. The method may further involve forming circuitry configured to place an electrical potential on the at least one conductive shielding plate. Selectively etching the TiN layer may form at least two conductive shielding plates that are electrically connected to one another, in which case the method may further involve forming circuitry configured to place an electrical potential on the electrically connected conductive shielding plates. Selectively etching the TiN layer may form at least two conductive shielding plates that are electrically isolated from one another, in which case the method may further involve forming circuitry capable of placing different electrical potentials on the electrically isolated conductive shielding plates. The method may further involve forming a plurality of standoffs. Selectively etching the TiN layer may form at least one electrode for passing an electrical signal to a MEMS device. The method may further involve forming an electrical conduit on an electrode for passing the electrical signal to the MEMS device.

In another embodiment there is provided an ASIC wafer comprising a top circuit layer, a passivation layer above the top circuitry layer layer, and a TiN layer on the passivation layer, the TiN layer configured to include at least one conductive shielding plate.

In various alternative embodiments, the passivation layer may include a bottom oxide layer, a middle nitride layer, and a top oxide layer. The TiN layer may be further configured to include a plurality of standoff bases. The ASIC wafer may include a plurality of standoffs. The ASIC wafer may include circuitry configured to place an electrical potential on the at least one conductive shielding plate. At least two conductive shielding plates may be electrically connected to one another and the ASIC wafer may include circuitry configured to place an electrical potential on the conductive shielding plates. Additionally or alternatively, at least two conductive shielding plates may be electrically isolated from one another and the ASIC wafer may include circuitry capable of placing different electrical potentials on the electrically isolated conductive shielding plates. The TiN layer may be further configured to include at least one electrode for passing an electrical signal to a MEMS device. The device may include an electrical conduit on an electrode for passing the electrical signal to the MEMS device.

In another embodiment there is provided an integrated wafer-level chip scale package device comprising an ASIC wafer coupled to a MEMS device, wherein the MEMS device includes at least one MEMS structure and wherein the ASIC wafer comprises a top circuit layer, a passivation layer above the top circuitry layer layer, and a TiN layer on the passivation layer, the TiN layer configured to include at least one conductive shielding plate.

In various alternative embodiments, the passivation layer may include a bottom oxide layer, a middle nitride layer, and a top oxide layer. The TiN layer may be further configured to include a plurality of standoff bases. The device may include a plurality of standoffs. The device may include circuitry configured to place an electrical potential on the at least one conductive shielding plate. At least two conductive shielding plates may be electrically connected to one another and the device may include circuitry configured to place an electrical potential on the conductive shielding plates. Additionally or alternatively, at least two conductive shielding plates may be electrically isolated from one another and the device may include circuitry capable of placing different electrical potentials on the electrically isolated conductive shielding plates. The TiN layer may be further configured to include at least one electrode for passing an electrical signal to a MEMS device. The device may include an electrical conduit on an electrode for passing the electrical signal to the MEMS device.

Additional embodiments may be disclosed and claimed.

BRIEF DESCRIPTION OF THE DRAWINGS

The foregoing features of embodiments will be more readily understood by reference to the following detailed description, taken with reference to the accompanying drawings, in which.

It should be noted that the foregoing figures and the elements depicted therein are not necessarily drawn to consistent scale or to any scale. Unless the context otherwise suggests, like elements are indicated by like numerals.

DETAILED DESCRIPTION OF SPECIFIC EMBODIMENTS

In exemplary embodiments of the present invention, one or more conductive shielding plates are formed in a standard ASIC wafer top metal layer for blocking cross-talk from MEMS device structure(s) on the MEMS wafer to circuitry on the ASIC wafer when the MEMS device is capped directly by the ASIC wafer in a wafer-level chip scale package. Generally speaking, a shielding plate should be at least slightly larger than the MEMS device structure it is shielding (e.g., a movable MEMS structure such as an accelerometer proof mass or a gyroscope resonator), and the shielding plate cannot be in contact with the MEMS device structure during or after wafer bonding. Thus, a recess is formed to ensure that there is sufficient cavity space away from the top surface of the MEMS device structure. The shielding plate is electrically conductive and can be biased, e.g., to the same voltage as the opposing MEMS device structure in order to maintain zero electrostatic attraction force between the MEMS device structure and the shielding plate.

Figure 1:
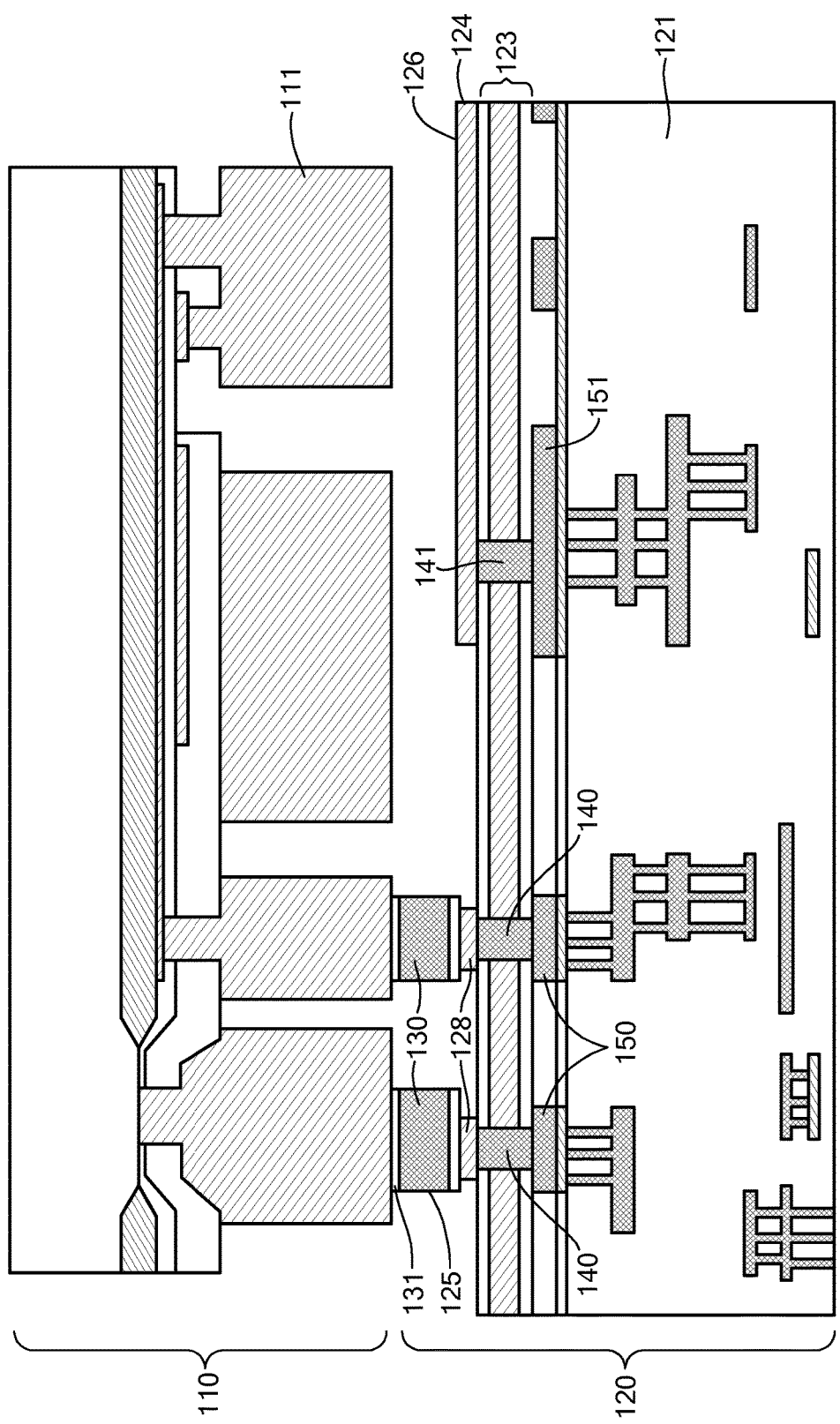
FIG. 1 is a schematic block diagram showing a cross-sectional view of wafer-level chip scale package in accordance with one exemplary embodiment of the present invention.

FIG. 1 is a schematic block diagram showing a cross-sectional view of wafer-level chip scale package 100 in accordance with one exemplary embodiment of the present invention. A MEMS wafer 110 having a MEMS structure 111 is bonded to a CMOS ASIC wafer 120 via a bonding material 131. As discussed more fully below, the ASIC wafer 120 is formed as a layered structure including, among other things, a top circuitry layer 121 having various metal bond pads 150 and 151, a passivation layer 123 above the circuitry layer 121, a TiN layer 124 formed on the passivation layer 123 from which is formed a conductive shielding plate 126 and various electrodes 128 for making electrical connections to the MEMS wafer 110, and a metal layer 125 in which is formed standoff structures (not shown in FIG. 1 for convenience) and electrical conduits 130 for extending the electrical connections to the MEMS wafer 110.

In this exemplary embodiment, the passivation layer is formed of three sub-layers, specifically a thin bottom oxide layer (e.g., silicon dioxide or $SiO_2$), a thin middle nitride layer (e.g., silicon nitride or SiN), and a thicker top oxide (OX) layer (e.g., silicon dioxide or $SiO_2$). Alternative embodiments may use other passivation materials. In this exemplary embodiment, various electrically conductive vias 140 and 141 couple the structures in the TiN layer 124 to corresponding metal bond pads 150 and 151 in the circuitry layer 121, e.g., to allow electric signals to be placed on the conductive shielding plate 126 and passed through to the MEMS wafer 110 through electrodes 128 and electrical conduits 130.

As discussed more fully below, the conductive shielding plate 126 is formed in the ASIC wafer top metallization layer opposite the MEMS structure 111. It should be noted that, although this exemplary embodiment shows one conductive shielding plate 126, alternative embodiments may have multiple conductive shielding plates, e.g., one conductive shielding plate for each of a number of MEMS structures.

Pertinent steps of an exemplary fabrication process for forming the conductive shielding plate 126 and other structures are now described with reference to FIG. 2.

Figure 2A:
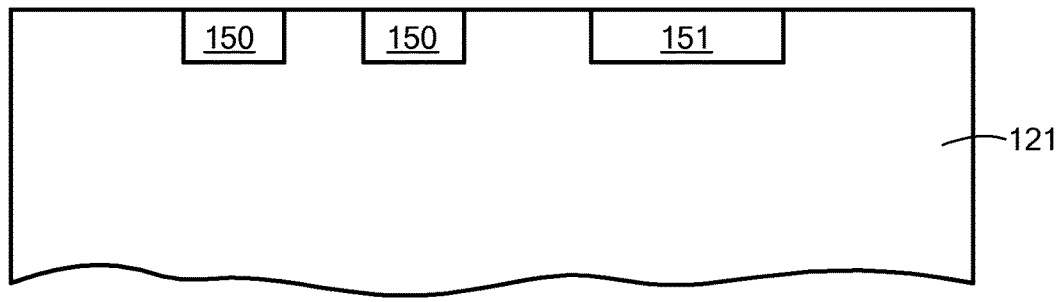
FIG. 2 comprising FIGS. 2A-2F schematically shows pertinent steps of an exemplary fabrication process for forming a conductive shielding plate and other structures, in accordance with one exemplary embodiment

FIG. 2A shows a cross-sectional view of an exemplary top circuitry layer 121 of an ASIC wafer. In this example, the top circuitry layer 121 includes metal bond pads 150 for passing electrical signals to the MEMS wafer 110 and includes a metal bond pad 151 for passing electrical signals to the conductive shielding plate 126. The metal bond pads 150 and 151 may be made from a metal such as AlCu. The metal bond pads 150 and 151 are coupled to corresponding underlying circuitry and are electrically insulated from one another, by an oxide material (e.g., High-Density Plasma oxide or HDP-OX).

Figure 2B:
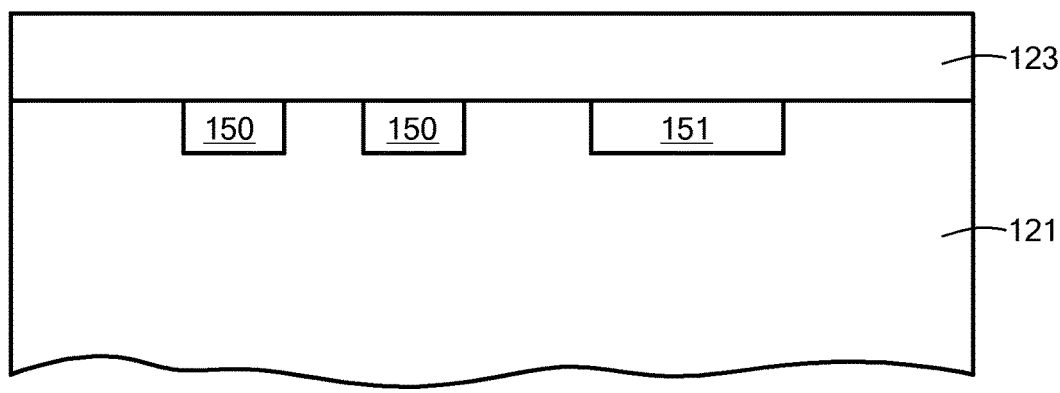

As shown in FIG. 2B, a passivation layer 123 is formed on the top circuitry layer 121. As discussed above, the passivation layer 123 in this exemplary embodiment includes three sub-layers, specifically a thin bottom oxide layer (e.g., $SiO_2$), a thin middle nitride layer (e.g., SiN), and thicker a top oxide layer (e.g., $SiO_2$). This oxide-nitride-oxide (O—N—O) passivation layer 123 is typically on the order of around 0.25-0.3 um thick. In certain exemplary embodiments, the oxide sub-layers and nitride sub-layer of the passivation layer 123 are formed using Plasma Enhanced Chemical Vapor Deposition (PECVD) at temperatures below around 450 degrees Celsius.

Figure 2C:
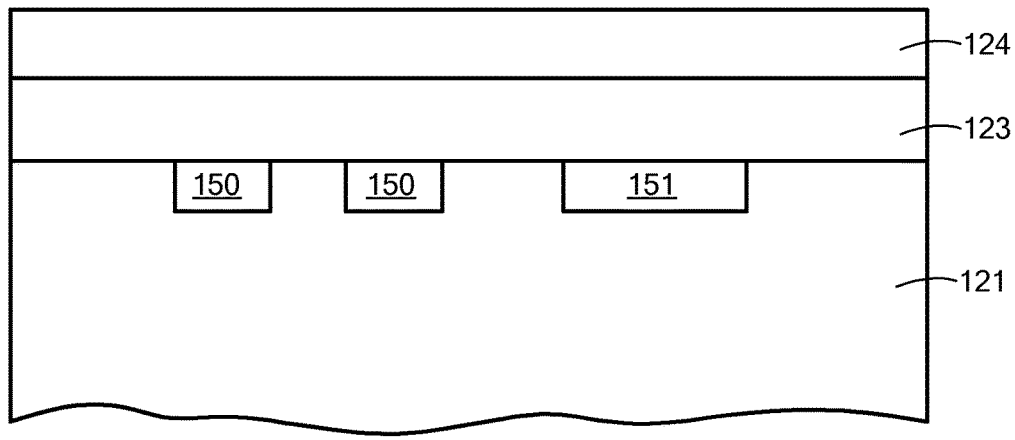

As shown in FIG. 2C, a TiN layer 124 is formed on the passivation layer 123. The TiN layer 124 is typically on the order of around 50-100 nm (nanometers) thick, preferably closer to 50 nm.

Figure 2D:
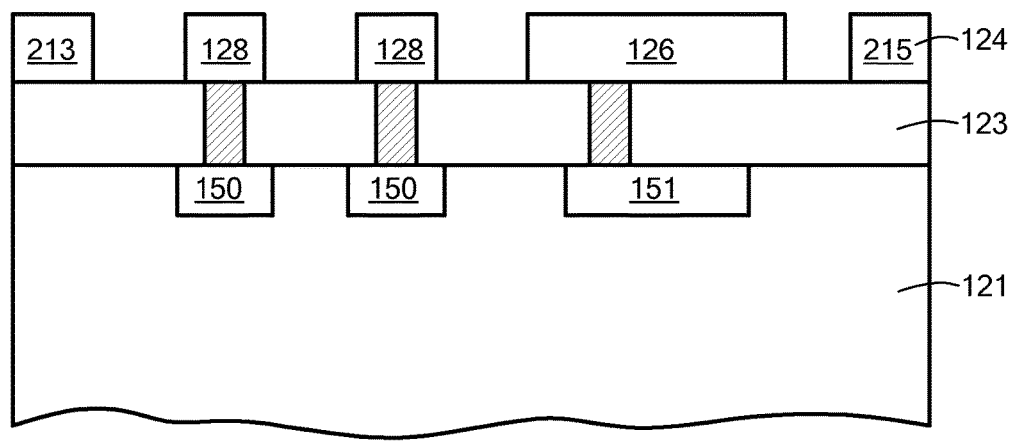

As shown in FIG. 2D, after the TiN layer 124 is formed, the TiN layer 124 is selectively etched to form various structures including the electrodes 128, the conductive shield plate 126, and standoff bases 213 and 215 (which may be omitted in certain embodiments). It should be noted that FIG. 2D shows the vias 140 and 141 in place, although the fabrication steps for forming the electrically conductive vias 140 and 141 are omitted for the sake of simplicity, as formation of an electrically conductive via is generally known in the art. Generally speaking, fabrication of the vias 140 and 141 would involve various etching and deposition steps to etch through the passivation layer 123 prior to formation of the TiN layer 124 in order to form openings extending from the top of the passivation layer 123 to the electrodes 150 and 151 and fill the openings with an electrically conductive material (e.g., a W or tungsten metal); when the TiN layer 124 is formed, the TiN layer 124 would make contact with the electrically conductive vias 140 and 141.

Figure 2E:
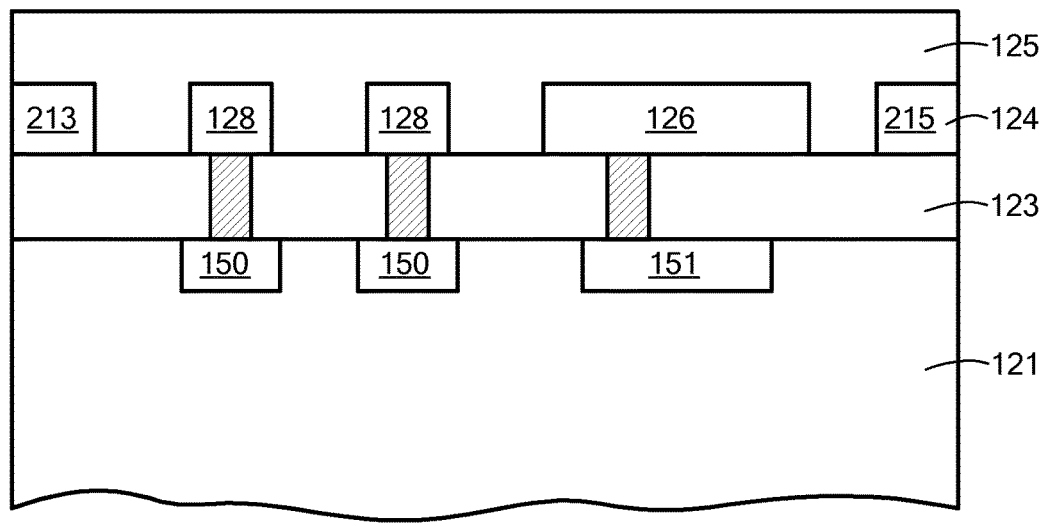

As shown in FIG. 2E, a metal layer 125 (optionally including one or more intermediate layers, not shown for convenience) is formed on the TiN layer 124. In certain exemplary embodiments, the metal layer 125 is formed of AlCu and is typically on the order of around 2-4 um thick.

In certain alternative embodiments in which the standoff bases 213 and 215 are omitted, the metal layer 125 (and any intermediate layer(s)) may be formed directly on the passivation layer 123.

Figure 2F:
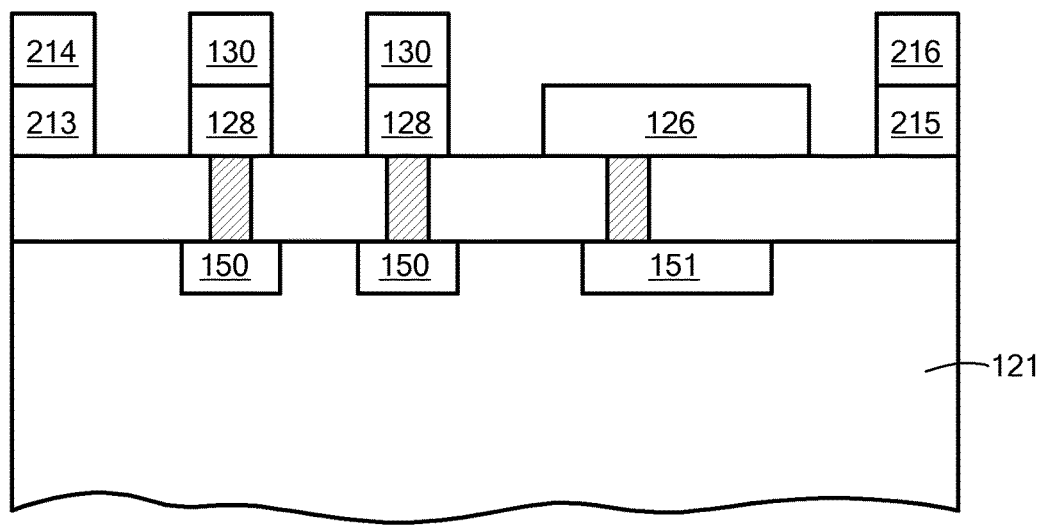

As shown in FIG. 2F, the metal layer 125 (and any intermediate layer(s)) is chemically etched to form standoffs 214 and 216 as well as electrical conduits 130. The standoffs 214 and 216 form bonding surfaces for bonding the ASIC wafer 120 to the MEMS wafer 110 and also act to provide a minimum separation between the ASIC wafer 120 and the MEMS wafer 110.

Figure 3:
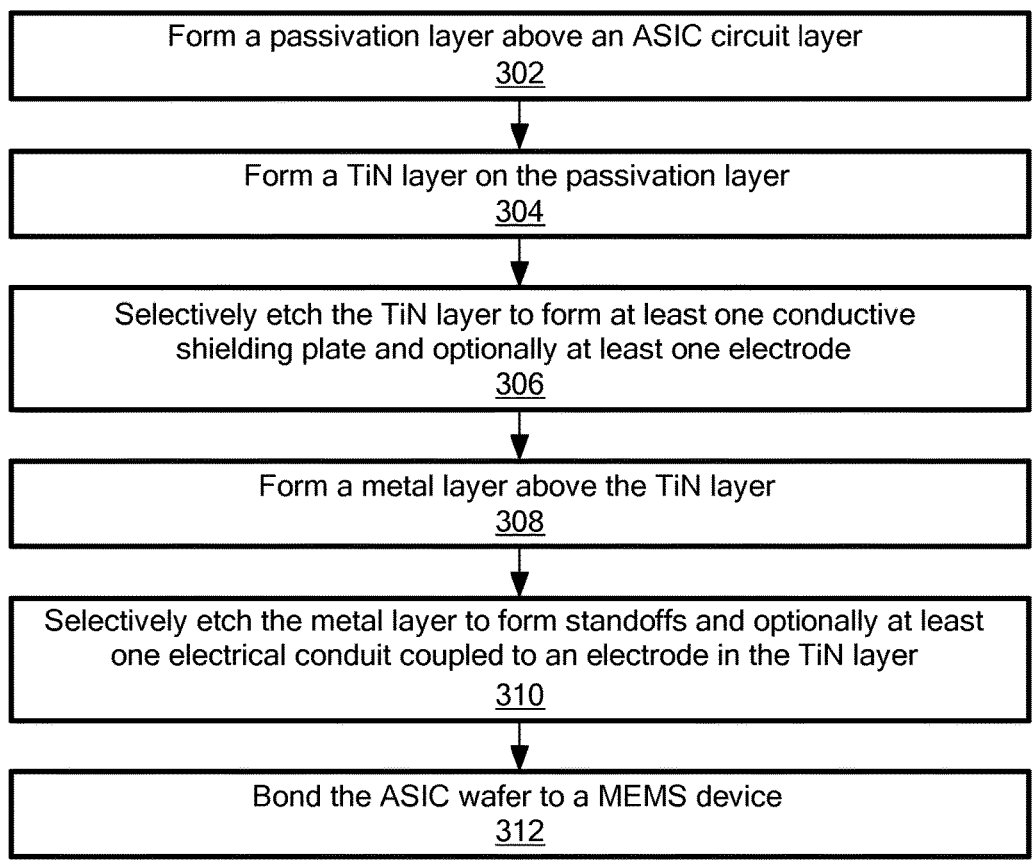
FIG. 3 is a logic flow diagram showing relevant steps in an ASIC fabrication process in accordance with the exemplary embodiment shown in FIG. 2.

FIG. 3 is a logic flow diagram showing relevant steps in an ASIC fabrication process in accordance with the exemplary embodiment shown in FIG. 2. In block 302, a passivation layer is formed above an ASIC circuit layer. In block 304, a TiN layer is formed on the passivation layer. In block 306, the TiN layer is selectively etched to form at least one conductive shielding plate and optionally at least one electrode. In block 308, a metal layer is formed above the TiN layer. In block 310, the metal layer is selectively etched to form standoffs and optionally at least one electrical conduit coupled to an electrode in the TiN layer. In block 312, the ASIC wafer is bonded to a MEMS device.

It should be noted that the exemplary ASIC fabrication processes involving the HDP-OX, PECVD SiO2, PECVD SiN, TiN, and AlCu layers are typical ASIC fabrication processes and hence exemplary embodiments of the present invention are expected to be fabricated with little or no extra cost using existing ASIC fabrication machinery.

During operation of the integrated device having a MEMS device capped directly by an ASIC wafer, a fixed or variable electrical potential is typically placed on the conductive shielding plate 126 from the metal bond pad 151 through the electrically conductive via 141, and a corresponding electrical potential is typically placed on the corresponding MEMS device structure from a metal bond pad 150 through an electrically conductive via 140, electrode 128, and electrical conduit 130. The electrical potential placed on the conductive shielding plate 126 may be the same as the electrical potential placed on the corresponding MEMS device structure or may be different than the electrical potential placed on the corresponding MEMS device structure. For example, the conductive shielding plate 126 may be grounded, while a fixed or variable electrical signal is applied to the MEMS device structure.

It should be noted that the conductive shielding plate 126 may be fabricated in virtually any size and/or shape as needed or desired for a particular application. Also, as discussed above, multiple conductive shielding plates may be fabricated using the processes described above, e.g., one conductive shielding plate placed opposite each of a number of MEMS structures. In embodiments having multiple conductive shielding plates, the ASIC wafer may be configured to allow different electrical potentials to be placed on different conductive shielding plates, e.g., to accommodate different biasing for different features.

Figure 4:
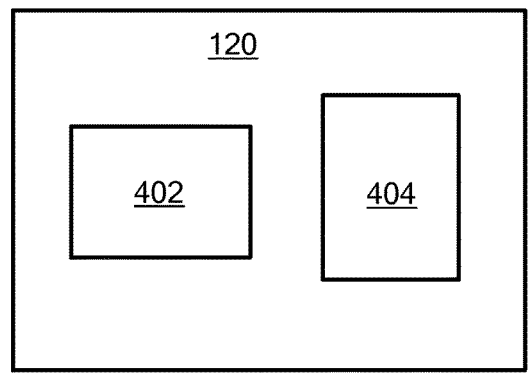
FIG. 4 is a schematic diagram showing an ASIC wafer including two conductive shielding plates configured to be placed opposite corresponding MEMS device structures when the ASIC wafer is bonded to the MEMS device.

FIG. 4 is a schematic diagram showing the ASIC wafer 120 including two conductive shielding plates 402 and 404 configured to be placed opposite corresponding MEMS device structures when the ASIC wafer is bonded to the MEMS device.

Figure 5:
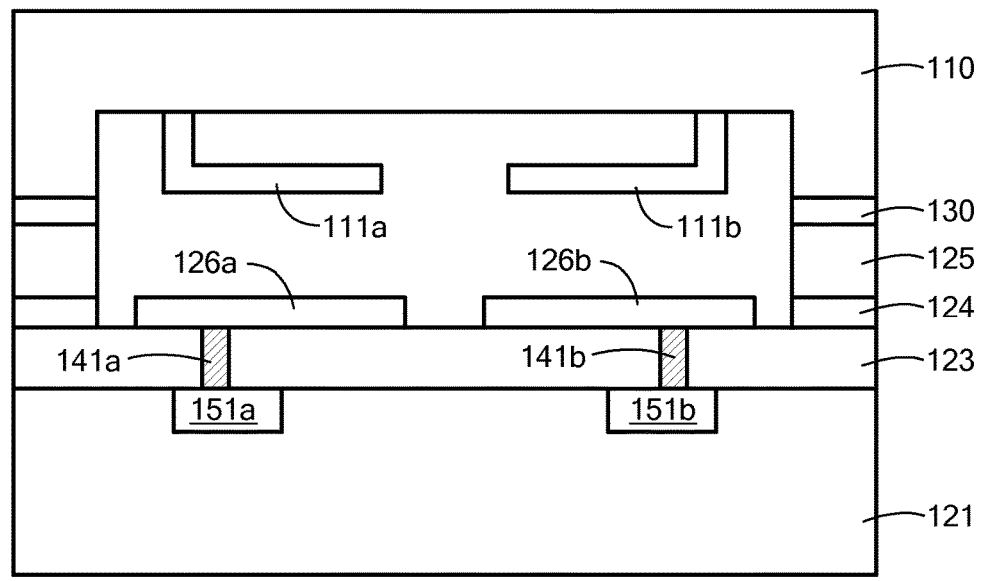
FIG. 5 is a schematic diagram showing multiple conductive shielding plates configured to allow a different electrical potential to be applied to each conductive shielding plate, in accordance with one exemplary embodiment.

FIG. 5 is a schematic diagram showing multiple conductive shielding plates configured to allow a different electrical potential to be applied to each conductive shielding plate, in accordance with one exemplary embodiment. In this example, there are two conductive shielding plates 126a and 126b placed opposite two MEMS structures 111a and 111b, respectively. The conductive shielding plates are electrically insulated from one another. Each conductive shielding plate 126a and 126b is electrically connected to a respective electrode 151a and 151b through a respective electrically conductive via 141a and 141b. The ASIC wafer may be configured to apply the same electrical potential to the two conductive shielding plates or may be configured to apply different electrical potentials to the two conductive shielding plates.

It should be noted that the MEMS device may by virtually any type of MEMS device having virtually any type(s) of movable MEMS structure(s). For example, the MEMS device may include an accelerometer having one or more movable proof masses, a gyroscope having one or more resonant masses, a microphone having one or more diaphragms, or other types of MEMS devices having other types of movable MEMS structures. MEMS gyroscopes, in particular, often include more than one sensor element (e.g., 2-4 sensor elements) inside the cavity for two- or three-axis sensing. Multiple conductive shielding plates (e.g, 2-4 or more) may be used to create separate zones (e.g., above each sensor element) for individual biasing independently to allow improved performance, e.g., to prevent the ASIC wafer cap from unbalancing the sensor(s). Unlike implementations in which the entire cap is at a common potential, by dividing the cap into multiple regions that are electrically isolated from each other, these regions can be used to selectively apply tuning or calibration signals to different areas of the sensor or to multiple sensors in the same cavity. For example, a multiple axis gyroscope could have one voltage applied over an area affecting one axis and a separate bias voltage applied over the area for another axis. These voltages can then tune the gyroscope resonance frequencies independently. A separate possible use is to inject a carrier signal that can be used for detecting undesired motion in the sensor, which may otherwise be rejected if the carrier is injected uniformly from the cap into the whole structure. For many capping processes, the cap position and distance from the sensor are not as precisely controlled as other dimensions. Because of this, the cap signal may be used in conjunction with control loops that will adjust the bias voltage to remove an error signal, or adjust other controls biased on carrier signals injected from the cap such that the injected carrier is cancelled out.

The present invention may be embodied in other specific forms without departing from the true scope of the invention, and numerous variations and modifications will be apparent to those skilled in the art based on the teachings herein. Any references to the "invention" are intended to refer to exemplary embodiments of the invention and should not be construed to refer to all embodiments of the invention unless the context otherwise requires. The described embodiments are to be considered in all respects only as illustrative and not restrictive.

What is claimed is:

1. A method for forming a conductive shielding plate on an application specific integrated circuit (ASIC) wafer, the ASIC wafer including a top circuitry layer, the method comprising:
   forming a passivation layer above the top circuitry layer;
   forming a TiN layer above the passivation layer;
   selectively etching the TiN layer to form at least one conductive shielding plate; and
   positioning a microelectromechanical systems (MEMS) structure such that the at least one conductive shielding plate is between the top circuitry layer and the MEMS structure.

2. A method according to claim 1, wherein the TiN layer is a top metallization layer of the ASIC wafer.

3. A method according to claim 1, wherein the top circuitry layer comprises:
circuitry configured to place an electrical potential on the at least one conductive shielding plate.

4. A method according to claim 1, wherein the at least one conductive shielding plate includes a plurality of conductive shielding plates that are electrically isolated from one another, and wherein the top circuitry layer includes circuitry configured to bias at least two of the electrically isolated conductive shielding plates with respective electrical potentials.

5. A method according to claim 1, wherein the conductive shielding plate is larger than the MEMS structure in at least one dimension substantially parallel to an upper surface of the ASIC wafer.

6. A method according to claim 1, wherein positioning the MEMS structure comprises coupling a MEMS substrate to the ASIC wafer.

7. A method according to claim 1, further comprising forming a TiN electrode from the TiN layer for passing an electrical signal from circuitry in the top circuitry layer to a MEMS device.

8. A method according to claim 7, further comprising:
forming an electrical conduit on the TiN electrode for passing the electrical signal to the MEMS device.

9. A method according to claim 1, further comprising:
forming a plurality of TiN standoff bases from the TiN layer.

10. A method according to claim 9, further comprising:
forming a plurality of standoffs on the TiN standoff bases.

11. An ASIC substrate comprising:
a top circuitry layer;
a passivation layer above the top circuitry layer; and
a TiN layer on the passivation layer, the TiN layer configured to include at least one conductive shielding plate configured to be positioned between the top circuitry layer and a microelectromechanical system (MEMS) structure.

12. An ASIC substrate according to claim 11, wherein the TiN layer is a top metallization layer of the ASIC substrate.

13. An ASIC substrate according to claim 11, wherein the top circuitry layer includes circuitry configured to electrically bias the at least one conductive shielding plate.

14. An ASIC substrate according to claim 11, wherein the at least one conductive shielding plate includes a plurality of conductive shielding plates that are electrically isolated from one another, and wherein the top circuitry layer includes circuitry configured to bias at least two of the electrically isolated conductive shielding plates with respective electrical potentials.

15. An ASIC substrate according to claim 11, wherein the conductive shielding plate is larger than the MEMS structure in at least one dimension substantially parallel to an upper surface of the ASIC substrate.

16. An ASIC substrate according to claim 11, wherein the conductive shield plate has a surface area greater than a surface area of the MEMS structure.

17. An ASIC substrate according to claim 11, further comprising:
a TiN electrode formed from the TiN layer for passing an electrical signal from circuitry in the top circuitry layer to a MEMS device.

18. An ASIC substrate according to claim 17, further comprising:
an electrical conduit formed on the TiN electrode for passing the electrical signal to the MEMS device.

19. An ASIC substrate according to claim 18, further comprising:
a plurality of TiN standoff bases formed from the TiN layer.

20. An ASIC substrate according to claim 19, further comprising:
a plurality of standoffs formed on the TiN standoff bases.

21. An integrated chip scale package device comprising an ASIC substrate coupled to a MEMS device, wherein the MEMS device includes at least one MEMS structure and wherein the ASIC substrate comprises:
a top circuitry layer;
a passivation layer above the top circuitry layer; and
a TiN layer on the passivation layer, the TiN layer configured to include at least one conductive shielding plate positioned between the top circuitry layer and the at least one MEMS structure.

22. An integrated chip scale package device according to claim 21, wherein the TiN layer is a top metallization layer of the ASIC substrate.

23. An integrated chip scale package device according to claim 21, wherein the top circuitry layer includes circuitry configured to electrically bias the at least one conductive shielding plate.

24. An integrated chip scale package device according to claim 21, wherein the at least one conductive shielding plate includes a plurality of conductive shielding plates that are electrically isolated from one another, and wherein the top circuitry layer includes circuitry configured to bias at least two of the electrically isolated conductive shielding plates with respective electrical potentials.

25. An integrated chip scale package device according to claim 21, wherein the conductive shielding plate is larger than the MEMS structure in at least one dimension substantially parallel to an upper surface of the ASIC substrate.

26. An integrated chip scale package device according to claim 21, further comprising:
a TiN electrode formed from the TiN layer for passing an electrical signal from circuitry in the top circuitry layer to a MEMS device.

27. An integrated chip scale package device according to claim 26, further comprising:
an electrical conduit on the TiN electrode for passing the electrical signal to the MEMS device.

28. An integrated chip scale package device according to claim 21, further comprising:
a plurality of TiN standoff bases formed from the TiN layer.

29. An integrated chip scale package device according to claim 28, further comprising:
a plurality of standoffs formed on the TiN standoff bases.

* * * * *